United States Patent [19]
Zachrai

[11] Patent Number: 5,801,331
[45] Date of Patent: Sep. 1, 1998

[54] SWITCHGEAR CABINET WITH DOOR AND COVER

[75] Inventor: Jürgen Zachrai, Dillenburg, Germany

[73] Assignee: Rittal-Werk Rudolf Loh GmbH & Co. KG, Herborn, Germany

[21] Appl. No.: 776,982

[22] PCT Filed: Mar. 1, 1996

[86] PCT No.: PCT/EP96/00868

§ 371 Date: Feb. 4, 1997

§ 102(e) Date: Feb. 4, 1997

[87] PCT Pub. No.: WO96/27933

PCT Pub. Date: Sep. 12, 1996

[30] Foreign Application Priority Data

Mar. 7, 1995 [DE] Germany .................. 195 07 731.8

[51] Int. Cl.$^6$ .................. H02G 3/08; H02B 5/00
[52] U.S. Cl. .................. 174/52.1; 361/605; 361/692; 312/223.1; 312/100; 312/327
[58] Field of Search .................. 361/692, 726, 361/759, 801, 610, 688, 690, 693, 605; 312/327, 328, 223.1, 100; 174/52.1

[56] References Cited

U.S. PATENT DOCUMENTS

| | | | |
|---|---|---|---|
| 4,179,169 | 12/1979 | Daniels et al. | 312/257 R |
| 4,717,216 | 1/1988 | Hornak | 312/257 R |
| 4,821,143 | 4/1989 | Holmgren et al. | 312/335 |

FOREIGN PATENT DOCUMENTS

| | | |
|---|---|---|
| 281928 | 6/1970 | Austria . |
| 1109750 | 6/1961 | Germany . |
| 1904552 | 11/1964 | Germany . |

*Primary Examiner*—Kristine L. Kincaid
*Assistant Examiner*—Hung V. Ngo
*Attorney, Agent, or Firm*—Speckman Pauley Petersen & Fejer

[57] ABSTRACT

A switchgear cabinet with a door and with a cover secured to its top side. In order to make it easier to mount the cover on the switchgear cabinet, the cover has a bottom part connected to the top side of the switchgear cabinet and a top part that covers the bottom part. The top part is joined at a rear side to the bottom part by plug or hinge joints and has at its front side holding flaps that are hooked and held by a bent border of the switchgear cabinet door when the cover and door are in their closed position.

12 Claims, 2 Drawing Sheets

SWITCHGEAR CABINET WITH DOOR AND COVER

BACKGROUND OF THE INVENTION

1. Field of the Invention

This invention relates to a switchgear cabinet with a cabinet door and a cover fastened on a top of the switchgear cabinet.

2. Description of Prior Art

In connection with known switchgear cabinets of a similar type, the cover is primarily used for covering an air-conditioning unit or the like, which is fastened on the switchgear cabinet. The cover is maintained in a locked position with quick-release closures, wherein the components of the quick-release closures are fastened to the switchgear cabinet and the cover.

SUMMARY OF THE INVENTION

It is one object of this invention to produce a switchgear cabinet of a type mentioned above, wherein the cover can be attached on the switchgear cabinet in the simplest manner.

In accordance with this invention the above object and others are attained with a cover that has a lower element, connected with the top of the switchgear cabinet, and of a roof element covering the lower element. The roof element is connected on a back with the lower element by plug or hinge connections with the lower element. The roof element has holding brackets on the front which, in the closed position of the roof element and the cabinet door, are overlapped and held by a bevel of the cabinet door.

With the cabinet door open, the cover which has the lower element and the roof element can be opened. The roof element can be swung or rotated upward by the plug or hinge connections on the back. If the roof element is moved into the closed position on the lower element, the roof element is maintained in the closed position by the holding brackets when the cabinet door is closed. The holding brackets of the closed roof element project into a pivot area of the cabinet door in such a way that the bevel of the latter extends over the holding brackets. In the case of plug connectors on the back, the roof part can also easily be released from the bottom element when the cabinet door is open.

In accordance with one embodiment of this invention, the lower element is designed as a frame and has ventilating slits in the lateral walls. In this embodiment the cover advantageously acts as the receptacle for an air-conditioning unit or the like.

If in the closed position the roof element covers with spacing the lateral sides of the lower element with its lateral sides, ventilation of the cover is not hampered even in the closed position of the roof element.

In order to easily remove water which may enter the roof element, in a further embodiment of this invention, the roof element has roof sections which are inclined toward the front and toward the back.

The lower element is designed in such a way that the lower element has beveled bars at least at the front and back lateral walls, which are used for the support of the roof element and for fastening the lower element on the top of the switchgear cabinet.

In accordance with another embodiment of this invention, in the closed position the lateral sidewalls of the roof element partially cover the lateral walls of the switchgear cabinet in a spaced manner in order to cover the lateral transition between the switchgear cabinet and the cover.

BRIEF DESCRIPTION OF THE DRAWINGS

This invention will be explained in detail using an exemplary embodiment represented in the drawings wherein.

DESCRIPTION OF PREFERRED EMBODIMENTS

Figure 1:
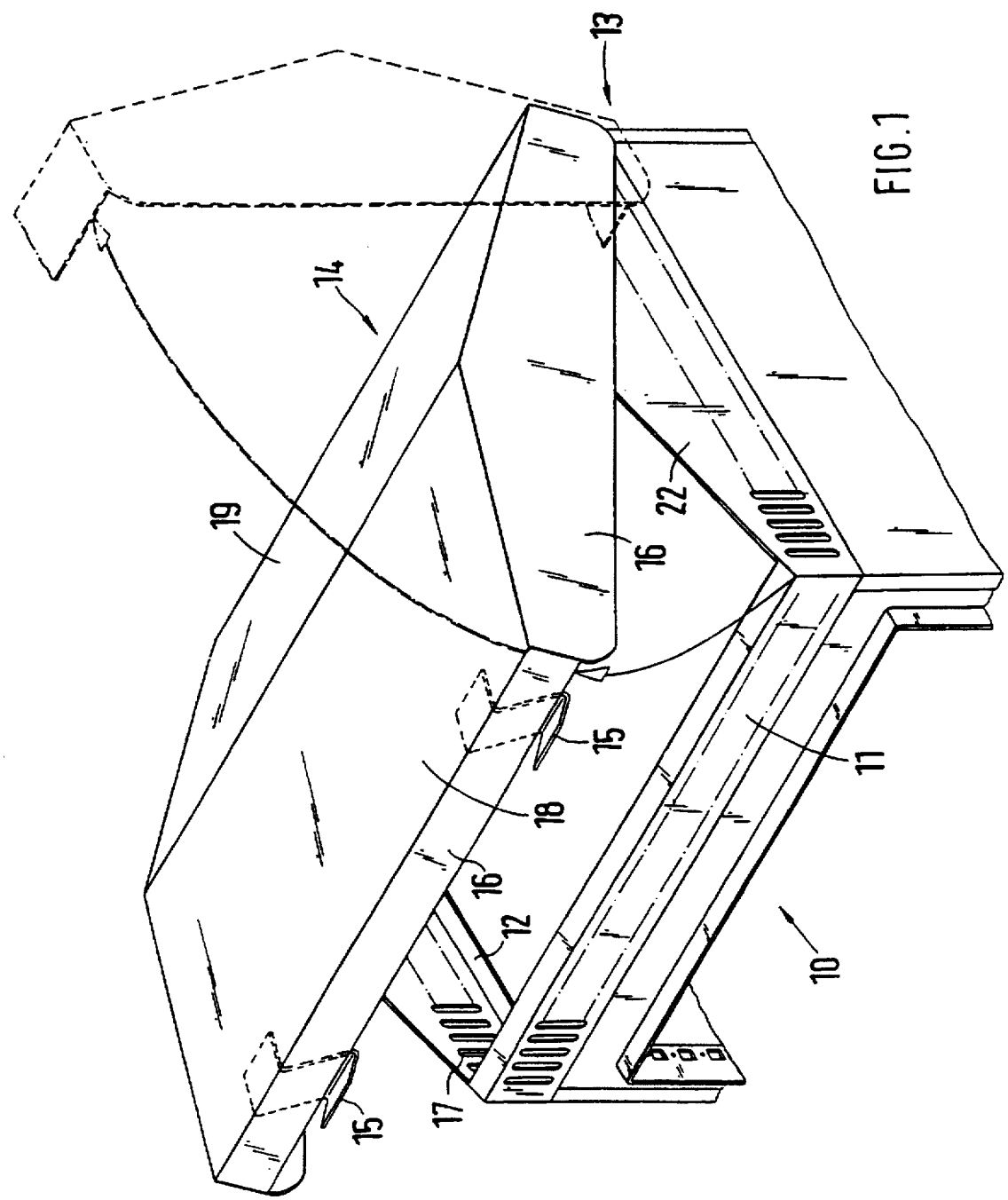
FIG. 1 is a top perspective view of a switchgear cabinet with a cover built thereon.

The top of a switchgear cabinet 10 is shown in FIG. 1, having sides covered by wall elements. The top is covered by means of a cover wall if a cover 14 placed on it is only used as a receptacle for accessories or the like. But if the cover 14 is used for housing an air-conditioning unit or the like, the cover wall of the switchgear cabinet 10 has openings, through which air can be aspirated from the switchgear cabinet 10 and cooling air can be supplied to the switchgear cabinet 10.

Figure 2:
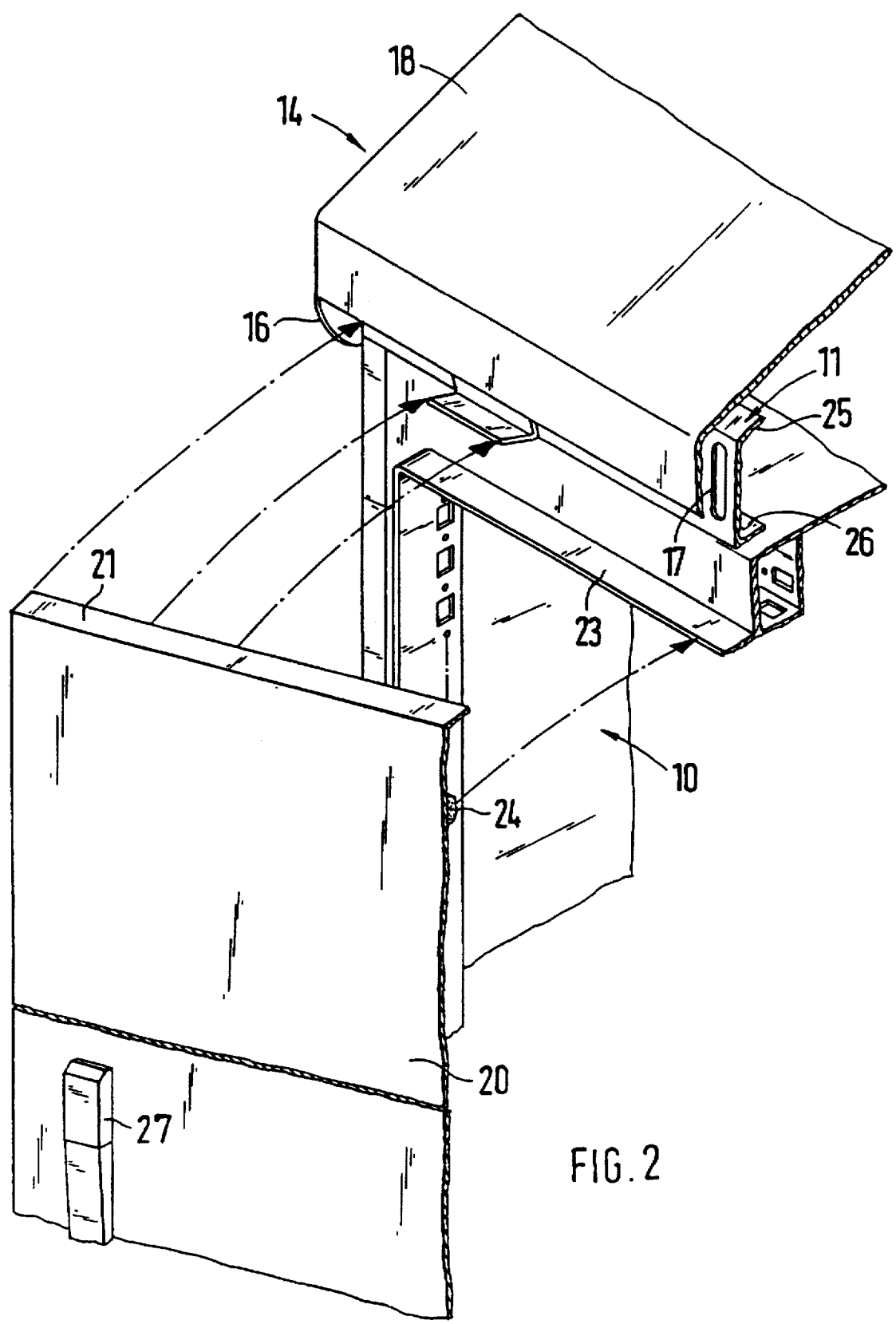
FIG. 2 is a perspective partial sectional view showing cooperation of the cabinet door and the roof element for fixing the closed position of the cover.

The cover 14 comprises a lower frame element 11, with lateral walls 22 that end flush with outsides of the switchgear cabinet 10 and that have ventilation slits 17. The lateral walls 22 have inwardly oriented bars 25 and 26, as shown in FIG. 2, which are used as a support for the cover 14 and for fastening the lower element 11 on the switchgear cabinet 10.

The cover 14 is attached on a back of the lower element 11 by means of plug or hinge connections 13 to the lower element 11 in such a way that the cover 14 can be tilted upward, as shown in FIG. 1. The front side wall 16 of the cover 14 has projecting holding brackets 15 which, in the closed position of the cover 14, extend into the pivot area of a cabinet door 20, which has bevels 21, in such a way that in the closed position of the cabinet door 20 the bevel 21 overlaps the holding bracket 15. In this way the cover 14 is held in its closed position, but only as long as the cabinet door 20 is in the closed position. On its interior, the cabinet door 20 has sealing elements 24 which, in the closed position, provide sealing of the open cabinet front by means of a sealing strip 23 of the switchgear cabinet 10. In the closed position the cabinet door 20 is locked by means of a lock 25. The lateral side walls 16 of the cover 14, which has roof sections 18 and 19 and which are inclined toward the front and back, cover the lateral walls 22 of the lower element 11 with a spacing therebetween, as well as the lateral walls of the switchgear cabinet in part. In this way ventilation of the cover 14 is not hampered, even in the closed position, but the transition between the switchgear cabinet 10 and the lower element 11 of the cover 14 is protected.

The switchgear cabinet 10 itself can have a rack which is assembled from frame legs and covered by means of wall elements. But a part of the frame legs can also be beveled at the wall elements. In every case the frame legs have rows of fastening receptacles and/or fastening bores.

Access to the built-ins, devices and the like housed in the cover 14 is further eased in that the cover 14 can be fixed in place in the opened state. The cover 14 then remains in the opened position and does not need to be supported in it.

I claim:

1. A switchgear cabinet having a cabinet door and a cover fastened on a top of the switchgear cabinet, comprising:
   a lower element (11) connected with the top of the switchgear cabinet (10) and the cover (14) covering the lower element (11), the cover (14) being connected on a back of the cover (14) with the lower element (11) by one of a plug and a hinge connection, and the cover (14) having a plurality of holding brackets (15) on a front, the cabinet door (20) mounted with respect to the lower element (11) to move between an open door position and a closed door position, and in a closed position of the cover (14) and the closed door position the cabinet door (20) the holding brackets (15) being overlapped and held by a bevel (21) of the cabinet door (20).

2. The switchgear cabinet in accordance with claim 1, wherein the lower element (11) is a frame and has a plurality of ventilating slits (17) in a plurality of lateral walls (22) of the lower element (11).

3. The switchgear cabinet in accordance with claim 2, wherein the cover (14) has a plurality of roof sections (18, 19) which are inclined toward the front and the back of the cover (14).

4. The switchgear cabinet in accordance with claim 3, wherein the cover is a receptacle for an air-conditioning unit.

5. The switchgear cabinet in accordance with claim 4, wherein the lower element (11) has beveled bars (25, 26) at least at the front and back, the beveled bars (25, 26) are used to support the cover (14) and to fasten the lower element (11) on the top of the switchgear cabinet (10).

6. The switchgear cabinet in accordance with claim 5, wherein in the closed position, lateral sidewalls (16) of the cover (14) partially cover the lateral walls (22) with a spacing therebetween.

7. The switchgear cabinet in accordance with claim 6, wherein in an opened position the cover (14) is fixed in position with respect to the switchgear cabinet (10).

8. The switchgear cabinet in accordance with claim 1, wherein the cover (14) has a plurality of roof sections (18, 19) which are inclined toward the front and the back of the cover (14).

9. The switchgear cabinet in accordance with claim 1, wherein the cover is a receptacle for an air-conditioning unit.

10. The switchgear cabinet in accordance with claim 1, wherein the lower element (11) has beveled bars (25, 26) at least at the front and back, the beveled bars (25, 26) are used to support the cover (14) and to fasten the lower element (11) on the top of the switchgear cabinet (10).

11. The switchgear cabinet in accordance with claim 1, wherein in the closed position a plurality of lateral sidewalls (16) of the cover (14) partially cover lateral walls (22) with a spacing therebetween.

12. The switchgear cabinet in accordance with claim 1, wherein in an opened position, the cover (14) is fixed in position with respect to the switchgear cabinet (10).

* * * * *